United States Patent
Arami (10) Patent No.: US 7,658,801 B2
(45) Date of Patent: Feb. 9, 2010

(54) HEAT TREATMENT APPARATUS

(75) Inventor: Junichi Arami, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/561,017

(22) PCT Filed: Jun. 22, 2004

(86) PCT No.: PCT/JP2004/008747

§ 371 (c)(1),
(2), (4) Date: Dec. 16, 2005

(87) PCT Pub. No.: WO2004/114377

PCT Pub. Date: Dec. 29, 2004

(65) Prior Publication Data

US 2007/0095289 A1      May 3, 2007

(30) Foreign Application Priority Data

Jun. 23, 2003   (JP)   .............................. 2003-178690

(51) Int. Cl.
*H01L 21/00* (2006.01)
*C23C 14/00* (2006.01)
*C23C 16/00* (2006.01)

(52) U.S. Cl. ...................... 118/725; 118/728; 118/724; 156/345.52; 156/345.51

(58) Field of Classification Search ................. 118/725, 118/728; 156/345.51, 345.52
See application file for complete search history.

(56) References Cited

U.S. PATENT DOCUMENTS

| 5,612,132 | A | * | 3/1997 | Goela et al. | .................. 428/332 |
| 5,904,872 | A | * | 5/1999 | Arami et al. | ............. 219/444.1 |
| 6,043,468 | A |   | 3/2000 | Toya et al. | |
| 6,254,687 | B1 | * | 7/2001 | Takahashi | .................. 118/725 |
| 6,369,361 | B2 | * | 4/2002 | Saito et al. | .................. 219/390 |
| 6,407,371 | B1 | * | 6/2002 | Toya et al. | .................. 219/553 |
| 6,448,536 | B2 | * | 9/2002 | Li et al. | ...................... 219/390 |
| 2003/0094446 | A1 | * | 5/2003 | Tay et al. | ..................... 219/411 |

FOREIGN PATENT DOCUMENTS

| JP | 63278322 A | * | 11/1988 |
| JP | 7-22500 | | 1/1995 |
| JP | 2000-21890 | | 1/2000 |
| JP | 2001-208478 | | 8/2001 |

\* cited by examiner

*Primary Examiner*—Ram N. Kackar
(74) *Attorney, Agent, or Firm*—Oblon, Spivak, McClelland, Maier & Neustadt, L.L.P.

(57) ABSTRACT

A heating means is disclosed which comprises a reflector plate composed of an opaque quartz and a quartz tube welded to the surface of the reflector plate. A carbon wire which generates heat when a current is applied is inserted in the quartz tube.

12 Claims, 7 Drawing Sheets

HEAT TREATMENT APPARATUS

FIELD OF THE INVENTION

The present invention relates to a heat treatment apparatus for the heat treatment of a semiconductor wafer or the like; and a heating unit and a mounting table for use therein.

BACKGROUND OF THE INVENTION

In general, in a manufacturing process of semiconductor integrated circuits, various single-substrate processes, such as a film forming process, an etching process, a heat treatment process, a quality modification process, a crystallization process, are repeated on a target object such as a semiconductor wafer to build up the desired integrated circuits. In the various processes described above, required gases corresponding to specific processes, e.g., a film forming gas for the film forming process, an ozone gas or the like for the quality modification process, and an $O_2$ gas or an inactive gas such as $N_2$ for the crystallization process, are introduced into processing chambers.

For example, in case of a single-wafer heat treatment apparatus which performs heat treatment on semiconductor wafers on a single wafer basis, a mounting table which includes, e.g., a built-in resistance heater or the like is installed in a vacuum-evacuable processing chamber and a semiconductor wafer is mounted on the top surface of the mounting table. Under these circumstances, a processing gas is introduced into the processing chamber, and heat treatment is variously performed on the semiconductor wafer under a process condition (see, for example, Japanese Patent Laid-open Application No. 2002-256440).

In a heat treatment apparatus of a different type, an inner processing chamber made of, e.g., quartz glass is provided in a vacuum-evacuable processing chamber made of, e.g., aluminum, and a substrate supporting table which includes a built-in resistance heater is prepared in the inner processing chamber. The inner processing chamber is supplied with a plurality of processing gases of different species flowing alternately in an intermittent manner. Hence, thin films each being about one molecular layer in thickness can be repeatedly laminated on the surface of the semiconductor wafer supported on the substrate supporting table (see, for example, Japanese Patent Laid-open Application No. 2002-151489).

However, it is required to make each layer thinner as well as to make the line width narrower in accordance with the high integration and the high miniaturization of the semiconductor integrated circuits. Under the circumstances, stricter standards for contamination, such as organic contamination and metal contamination, are also required. Therefore, structures in the processing chamber are made of purer materials which do not contain metal species serving as a source of contamination. The structures in the processing chamber include, e.g., a heater for heating a semiconductor wafer or the like, and a mounting table which supports a wafer. A mounting table was also proposed, wherein a heater is completely covered with high purity quartz plates and/or quartz cases thermally bonded as a single unit (see Japanese Patent Laid-open Application No. S63-278322, Japanese Patent Laid-open Application No. H07-078766, Japanese Patent Laid-open Application No. H03-220718, or Japanese Patent Laid-open Application No. H06-260430).

To encapsulate the whole heater inside the quartz plates and/or the quartz cases, planar quartz surfaces are required to be thermally bonded together. Therefore, quartz needs to be machined with good flatness. That is, surface processing of quartz is needed with high accuracy. Such a process, however, is very difficult, and the apparatus itself becomes costly.

Further, in case of using transparent quartz material, thermal efficiency becomes poor since heat rays from the heater buried inside the quartz radiate in all directions.

Moreover, if the heater material contains metal atoms of, e.g., heavy metals, a semiconductor wafer can be contaminated by such metal atoms even when the heater is completely encapsulated with quartz. That is because such metal atoms can move across the quartz by so-called thermal diffusion.

SUMMARY OF THE INVENTION

The present invention has been contrived on the basis of the aforementioned problems to solve them effectively. It is, therefore, an object of the present invention to provide a heating unit, a mounting table, and a heat treatment apparatus which can suppress such contaminations as organic contamination and metal contamination, and can be manufactured relatively easily and inexpensively.

The present invention provides a heating unit including: a reflector plate made of an opaque quartz; and a quartz tube welded to a surface of the reflector plate, wherein a carbon wire which generates heat when a current is applied thereto is inserted in the quartz tube.

In accordance with the present invention, a target object can be heated while barely suffering from organic contamination and/or metal contamination. Further, the heating unit of the present invention can be manufactured relatively easily and inexpensively.

Preferably, the quartz tube is bent.

Further, on the surface of the reflector plate, the quartz tube is preferably divided and welded to a plurality of zones.

The heating unit can be placed in a mounting table. That is, the present invention provides a mounting table includes: the heating unit having the above-described features; and a mounting table cover member installed to cover the whole quartz tube of the heating unit, a target object being mounted thereon, wherein the mounting table cover member is made of a light absorbing material.

In this case, the mounting table cover member is made of, e.g., SiC.

Further, the mounting table is employed in a heat treatment apparatus. That is, the present invention provides a heat treatment apparatus including: the mounting table having the above-described features; a processing chamber accommodating therein the mounting table; a gas supply unit for supplying a predetermined gas in the processing chamber; a vacuum pumping system for evacuating the inside of the processing chamber to vacuum.

Further, another embodiment of the present invention provides a heat treatment apparatus including: a mounting table on which a target object is mounted; a processing chamber accommodating therein the mounting table; a gas supply unit for supplying a predetermined gas in the processing chamber; a vacuum pumping system for evacuating the inside of the processing chamber to vacuum; and the heating unit, having the above-described features, prepared in the processing chamber so as to face the mounting table.

In this case, for example, an additional inner vessel can be installed to cover an upper side of the mounting table.

Still further, the present invention provides a heat treatment apparatus including: a mounting table on which a target object is mounted; a processing chamber accommodating therein the mounting table; a gas supply unit for supplying a predetermined gas in the processing chamber; a vacuum pumping system for evacuating the inside of the processing chamber to vacuum; a target object heating unit for heating the target object; an inner vessel installed in the processing chamber; the heating unit having the above-described features and installed between the inner vessel and an inner wall of the processing chamber to apply heat to the inner vessel.

In this case, the inner vessel is made of, e.g., sic.

Further, in this case, the target object heating unit is preferably built in the mounting table integrally.

DETAILED DESCRIPTION OF THE PREFERRED EMBODIMENTS

Hereinafter, a heating unit, a mounting table and a heat treatment apparatus in accordance with preferred embodiments of the present invention will be described in detail with reference to the accompanying drawings.

A First Preferred Embodiment

Figure 1:
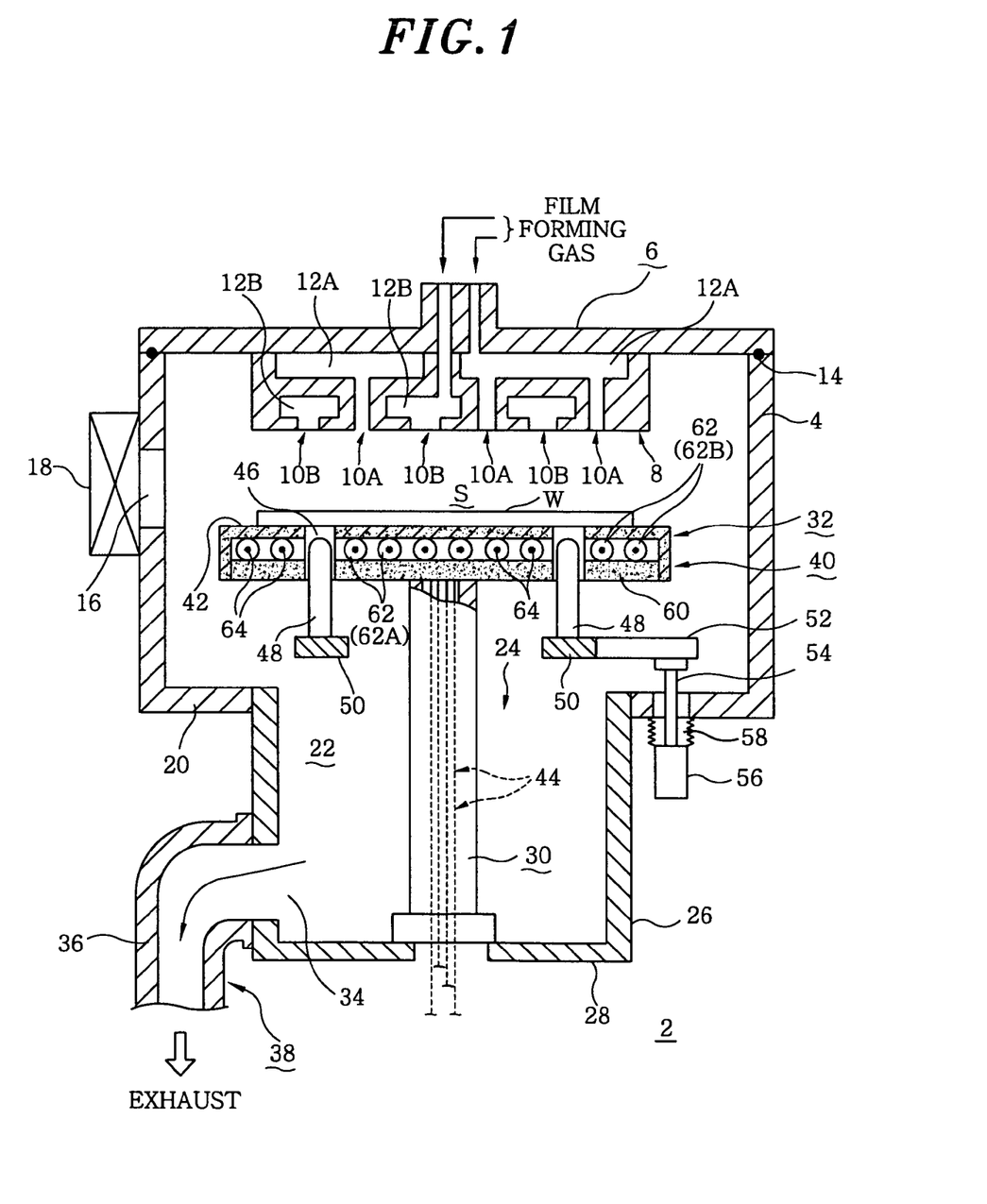
FIG. 1 provides a cross sectional configuration view of a heat treatment apparatus in accordance with a first preferred embodiment of the present invention.
Figure 2:
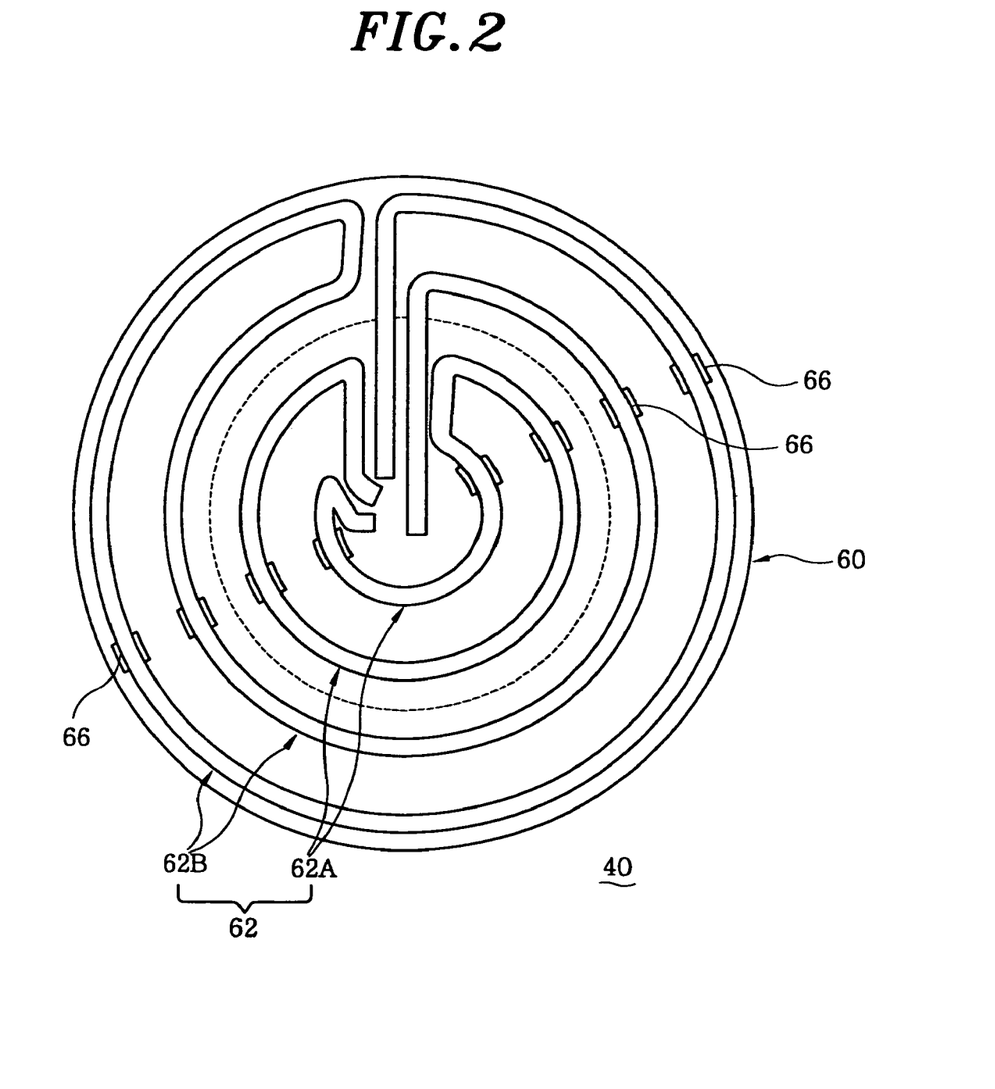
FIG. 2 shows a cross sectional view of an arrangement of quartz tubes provided in a mounting table.
Figure 3:
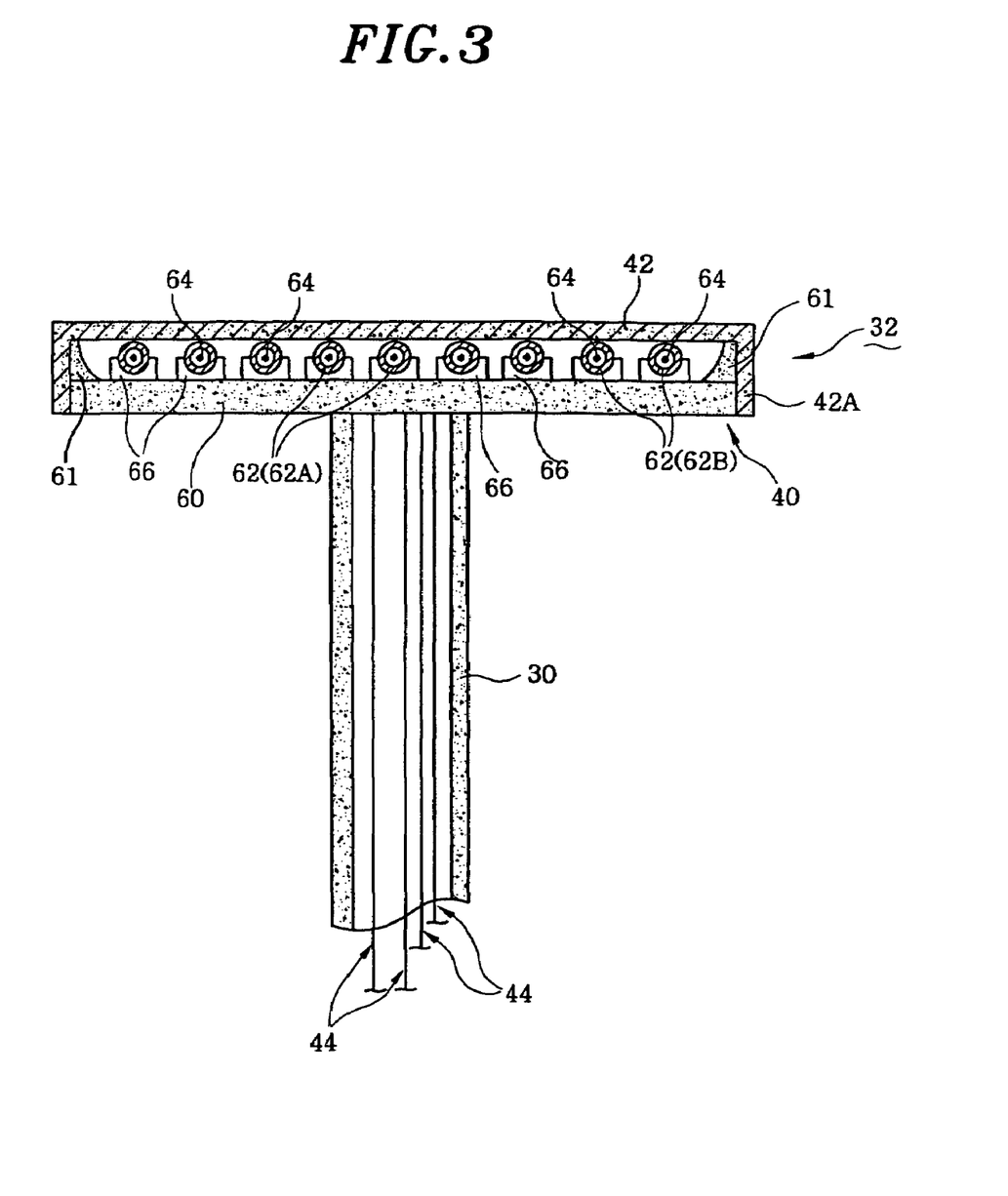
FIG. 3 presents a cross sectional view of the mounting table.

FIG. 1 provides a cross sectional configuration view of a heat treatment apparatus in accordance with the first preferred embodiment of the present invention; FIG. 2 shows a cross sectional view of an arrangement of quartz tubes provided in the mounting table; FIG. 3 presents a cross sectional view of the mounting table; and FIG. 4 sets forth an exploded view of the mounting table.

As shown, a heat treatment apparatus 2 has a processing chamber 4 whose inside is roughly cylindrical in shape and which is made of aluminum. Provided at the ceiling portion of the processing chamber 4 is a shower head unit 6 which is a gas supply means used to introduce necessary processing gases, for example, film forming gas. A gas injection surface 8 which is a bottom surface of the shower head unit 6 has a plurality of gas injection openings 10A and 10B. And, the processing gases are injected from the plurality of gas injection openings 10A and 10B to a processing space S.

Formed in this shower head unit 6 are two partitioned hollow gas diffusion areas 12A and 12B. The processing gases are diffused in the horizontal direction in the gas diffusion areas 12A and 12B, and then injected from the gas injection openings 10A and 10B connected to the gas diffusion areas 12A and 12B, respectively. That is, the gas injection openings 10A and 10B are arranged in a matrix shape.

The whole shower head unit 6 is made of, for example, nickel, nickel alloy such as Hastelloy (trademark) or the like, aluminum, or aluminum alloy. The shower head unit 6 may have only one gas diffusion area. And, at a joint portion between the shower head unit 6 and a top opening portion of the processing chamber 4, a sealing member which is composed of, e.g., an O-ring or the like is placed. Accordingly, airtightness is maintained in the processing chamber 4.

On a sidewall of the processing chamber 4, a loading/unloading port 16 is installed to load and unload a semiconductor wafer W as a target object. At the loading/unloading port 16, a gate valve 18 capable of airtightly opening and closing the loading/unloading port 16 is installed.

And, an exhaust space 22 is formed at a bottom portion 20 of the processing chamber 4. Specifically, a large opening 24 is formed at the center of the bottom portion 20 of the processing chamber 4, and a cylindrical partition wall 26 of a cylindrical body which has a bottom portion is extended downward from the opening 24, and the inside of the cylindrical partition wall 26 serves as the exhaust space 22. At the bottom portion 28 of the cylindrical partition wall 26 which partitions off the exhaust space 22, there is provided an upright cylindrical support column 30 made of, e.g., quartz glass. A mounting table 32 is fixed by welding onto an upper portion of the cylindrical support column 30. Further, the cylindrical support column 30 can be made of ceramic such as AlN.

The diameter of the opening 24 on the entrance side of the exhaust space 22 is set to be less than that of the mounting table 32. Accordingly, a processing gas which flows downward through the outside of the peripheral portion of mounting table 32, flows around to the bottom portion of the mounting table 32, and then flows into the opening 24. On a lower sidewall of the cylindrical partition wall 26, there is formed a gas exhaust port 34 connected to the exhaust space 22. A vacuum pumping system 38 is connected to the gas exhaust port 34. Specifically, the vacuum pumping system 38 is formed of a gas exhaust line 36 equipped with a vacuum pump (not shown). Accordingly, the atmosphere inside the processing chamber 4 and the exhaust space 22 can be pumped to be evacuated to vacuum.

A pressure control valve (not shown) capable of controlling the opening ratio is installed in the middle of the gas exhaust line 36. The internal pressure of the processing chamber 4 can be maintained at a constant level by controlling the opening ratio of the pressure control valve automatically, or a pressure value can be adjusted quickly to a desired level.

Further, the mounting table 32 is provided with a heating unit 40 which is a feature of the present invention. A mounting table cover member 42 is installed to cover the heating unit 40. At the top surface of the mounting table cover member 42, a semiconductor wafer W can be mounted as a target object. The configurations of the mounting table 32 and the heating unit 40 will be described in detail hereinafter.

The heating unit 40 is connected to feeder lines 44 disposed in the support column 30. Accordingly, while being controlled, electric powers are supplied to the heating unit 40. These feeder lines 44 are inserted in quartz tubes (not shown) in the drawings, and are connected to the power cables under the support column 30. Further, as will be described later, the heating unit 40 is divided into, for example, an inner zone and an outer zone which encloses the exterior of the inner zone in a concentric circular shape to control an electric power of each zone separately. For that purpose, four feeder lines 44 (see FIG. 3) are prepared in an example shown in the drawing.

A plurality of, for example, three pin insertion through holes 46 is provided through the mounting table 32 in vertical direction (FIG. 1 illustrates only two pin insertion through holes). A vertically movable upthrust pin 48 is inserted loosely through each pin insertion through hole 46. Under the upthrust pins 48, a circular ring-shaped upthrust ring 50 made of ceramic such as alumina is arranged. That is, the bottom of each vertically movable upthrust pin 48 is not fixedly supported by upthrust ring 50. An arm unit 52 extended from the upthrust ring 50 is connected to up/down rod 54 which passes through a bottom portion 20, and the up/down rod 54 is driven vertically by an actuator 56. Accordingly, the upthrust pins 48 move up or down from the upper end of pin insertion through holes 46 when replacing the wafer W. Further, between the actuator 56 and a through portion, at the bottom portion 20 of the processing chamber 4, through which the up/down rod 54 of the actuator 56 passes, an expansible bellows 58 is interposed. Accordingly, the up/down rod 54 can be vertically movable while maintaining the airtightness of the processing chamber 4.

The mounting table 32 and the heating unit 40 will now be described in detail with reference to FIGS. 2 to 4. The upthrust pins 48 and the pin insertion through holes 46 (see FIG. 1) are omitted in FIGS. 2 to 4.

Figure 4:
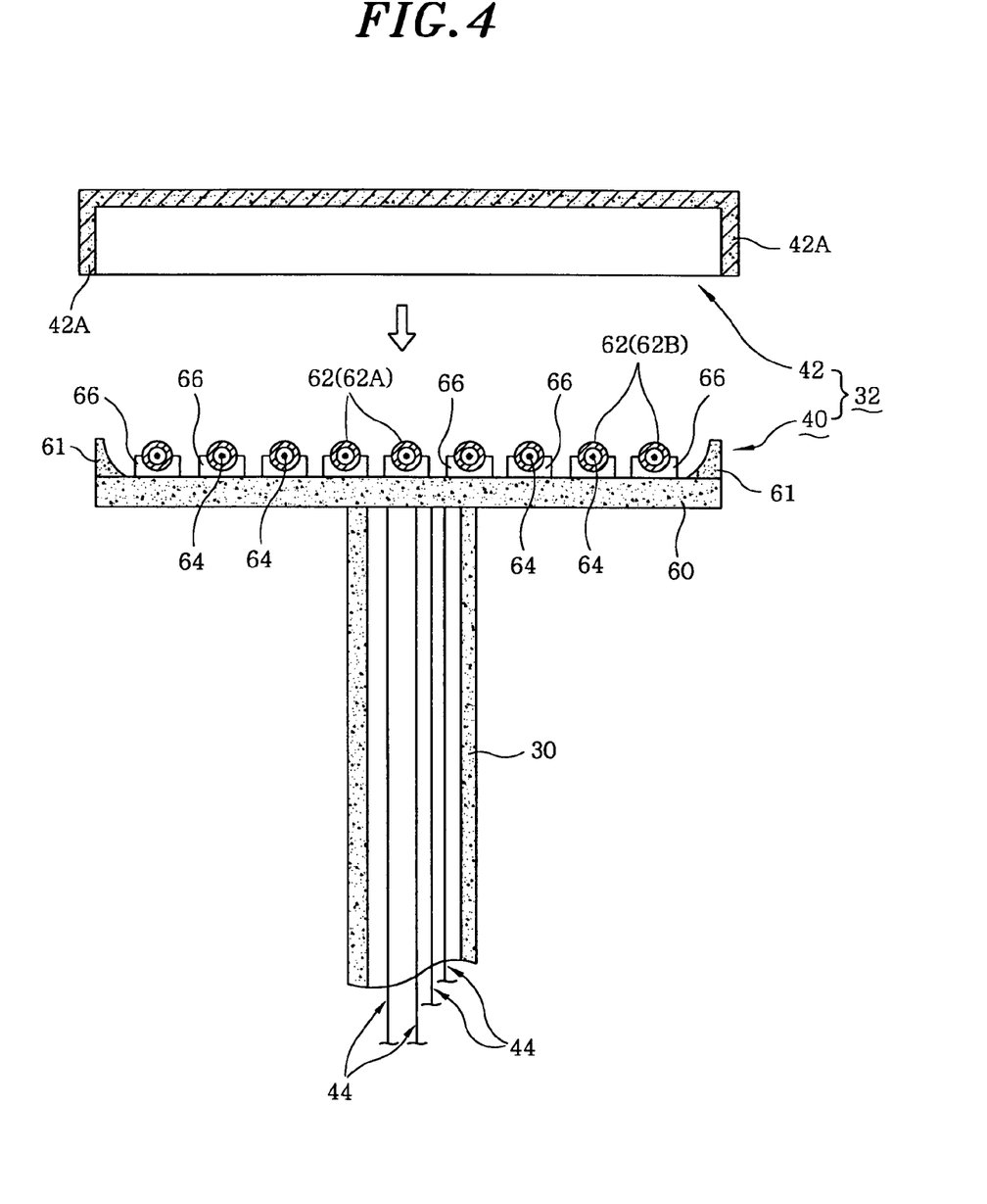
FIG. 4 sets forth an exploded view of the mounting table.

As shown in FIGS. 3 and 4, the mounting table 32 is primarily composed of the heating unit 40 and the mounting table cover member 42 prepared to cover the whole top surface of the heating unit 40. Here, the heating unit 40 functions as a target object heating unit which applies heat to the wafer W.

Specifically, the heating unit 40 has a circular plate-shaped reflector plate 60 which has a greater diameter than that of the wafer W. The whole reflector plate 60 is made of strongly heat-resistant opaque quartz which is white turbid since it is intermixed with fine bubbles. In this case, the surface of the reflector plate 60 is non-transparent to externally incident heat rays, and reflects the heat rays with high reflectivity. The opaque quartz forming the reflector plate 60 can be intermixed with any materials other than bubbles and the surface thereof may be mirror finished as long as it is non-transparent to heat rays.

Moreover, an upright positioning projection 61 is prepared in the upper direction at the peripheral region of the reflector plate 60. The positioning projection 61 performs the positioning of the mounting table cover member 42 which is inserted by the positioning projection 61. The positioning projection 61 can be made into a ring-shape by using the same material as that of the reflector plate 60. It can be installed integrally with the reflector plate 60 or separately from the reflector plate 60. In addition to performing the positioning of the mounting table cover member 42 as described above, the positioning projection 61 contacts with the mounting table cover member 42, and also functions to transfer heat efficiently from the reflector plate 60 to the mounting table cover member 42 (wafer W side). Accordingly, the falling of the temperature at the peripheral region of a wafer can be prevented and thus the temperature difference between the central portion and the peripheral portion of the wafer decreases.

And, the top end of the support column 30 made of quartz is welded around the center portion of the bottom surface of the reflector plate 60. Further, strongly heat-resistant and transparent quartz tubes 62 which are formed to be bent in a predetermined shape are welded to the top surface of the reflector plate 60. Carbon wires 64 which generate Joule heat when a current is applied thereto are inserted in these quartz tubes 62. A heater of this kind formed by inserting the carbon wire 64 in the quartz tube 62 is described in, e.g., Japanese Patent Laid-open Application No. 2001-208478 describes. When jointing the quartz tubes 62 to the surface of the reflector plate 60, joint pins 66, also made of quartz, are used. Specifically, these joint pins 66 are disposed at proper places between the quartz tubes 62 and the reflector plate 60, and by melting them, the quartz tubes 62 and the reflector plate 60 are welded together.

Herein, as shown in FIG. 2, the quartz tubes 62 are formed to be bent so that they include a quartz tube portion 62A in an inner zone and a quartz tube portion 62B in an outer zone which encompasses the exterior of the quartz tube portion 62A. Each of the quartz tube portions 62A and 62B has two concentric circular portions and two end portions which are concentered at the central portion of the reflector plate 60 for supplying electric power. The both end portions pass through the reflector plate 60 downward. And, as described above, the carbon wire 64 in each of the quartz tube portions 62A and 62B is connected to the feeder lines 44. Accordingly, application of electric power can be controlled separately in each zone. Further, the number of zones is not limited to 2. It may be 3 or more.

Each of the quartz tube portions 62A and 62B can be easily bent in a desired shape by heat process. Further, the quartz tube portions 62A and 62B are easily jointed to the surface of the reflector plate 60 by using the joint pins 66. Heat rays from the carbon wires 64 in the quartz tube portions 62A and 62B are reflected at the surface of the reflector plate 60 which has high heat-resistance, and directed upward in the example shown in the drawing.

Further, the mounting table cover member 42 is installed to cover the whole top surface of the heating unit 40 fabricated as described above. As a result, the whole mounting table 32 is constructed. Specifically, the mounting table cover member 42 is formed to have a circular lid shape and made of light absorbing material, e.g., SiC, which has a good thermal conductivity but with negligible metal impurities. An inner surface of a sidewall 42A of the lid-shaped mounting table cover member 42 is set to have a slightly greater diameter than that of the reflector plate 60, and it is in close contact with a side surface of the reflector plate 60 to be generally circumscribed thereto. Thus, when being attached to the reflector plate 60 from above, the mounting table cover member 42 is combined with the reflector plate 60 while being positioned at a specific place by the positioning projection 61. And, the wafer W is mounted on the top surface of the mounting table cover member 42. Further, the inner space of the mounting table cover member 42 may be sealed completely by airtightly thermal-bonding the peripheral regions of the mounting table cover member 42 and the reflector plate 60 together, and further, by thermal-bonding quartz pipes at portions of the pin insertion through holes 46 (see FIG. 1).

Hereinafter, the operation of the heat treatment apparatus with the above configuration will now be described.

First of all, a semiconductor wafer W not processed is held by a transfer arm (not shown) and loaded into the processing chamber 4 through the open gate valve 18 and the loading/unloading port 16. This wafer W is loaded on the upthrust pins 48 which are in their elevated position. And then, the upthrust pins 48 move down, and the wafer W is mounted and supported on the top surface of the mounting table 32, specifically on the top surface of the mounting table cover member 42.

And then, flow-controlled processing gases, e.g., film forming gases such as $TiCl_4$, $H_2$, $NH_3$, $WF_6$, $SiH_4$, $H_2$, PET, and $O_2$, are supplied into the shower head unit 6. These gases are emitted (injected) through the gas injection holes 10A and 10B into the processing space S. And, by driving continuously the vacuum pump (not shown) connected to the vacuum gas exhaust line 36, the atmosphere in the processing chamber 4 and the exhaust space 22 is exhausted to vacuum; and further, the opening ratio of the pressure control valve is controlled automatically, and thus the atmosphere in the processing space S is maintained at a predetermined process pressure level. At this time, the wafer W is heated by the heating unit 40 provided in the mounting table 32 and thus the temperature of the wafer is maintained at a predetermined process temperature level. Accordingly, thin films such as Ti, TiN, W, WSi, $Ta_2O_5$ are formed on the surface of the semiconductor wafer W. Further, when using TMA (Tri-Methyl Aluminum) and ozone as film forming gases, an alumina ($Al_2O_3$) film can be formed.

In the above process, heat rays from the carbon wires 64 inserted in quartz tubes 62 (62A and 62B) of the heating unit 40 radiate in all directions. Heat rays emitted downward, however, are reflected upward at the surface of the reflector plate 60 supporting and fixing quartz tubes 62 and made of opaque quartz, and thus apply heat to the mounting table cover member 42, and further, the wafer W mounted on the top surface thereof.

The reflector plate 60 which constitutes the heating unit 40 is made of high-purity opaque quartz which contains hardly any impurities. The quartz tubes 62 and the carbon wires 64 also contain hardly any impurities and thus have high purity. Accordingly, contamination such as organic contamination and/or metal contamination can be substantially suppressed. Moreover, the relatively easy fabrication processes for the reflector plate 60 and the quartz tubes 62 substantially reduce the manufacturing cost. Further, thermal energy can be used effectively and efficiently by using the reflector plate 60.

The mounting table cover member 42, which is a part constituting the mounting table 32, is made of a light absorbing material, e.g., SiC, having a good thermal conductivity and a high purity. Therefore, the mounting table cover member 42 can be heated while maintaining the in-surface temperature uniformity of the wafer W at a high level. The mounting table cover member 42 can be made of arbitrary light absorbing material, e.g., opaque quartz intermixed with carbon.

Furthermore, a large amount of electric power can be supplied since the main components of the heating unit 40 are made of quartz, strongly resistant to thermal shocks. Accordingly, a high temperature rising rate, for example, about 1000° C./5 minutes can be obtained.

A Second Preferred Embodiment

Hereinafter, the second preferred embodiment of the present invention will be described.

Figure 5:
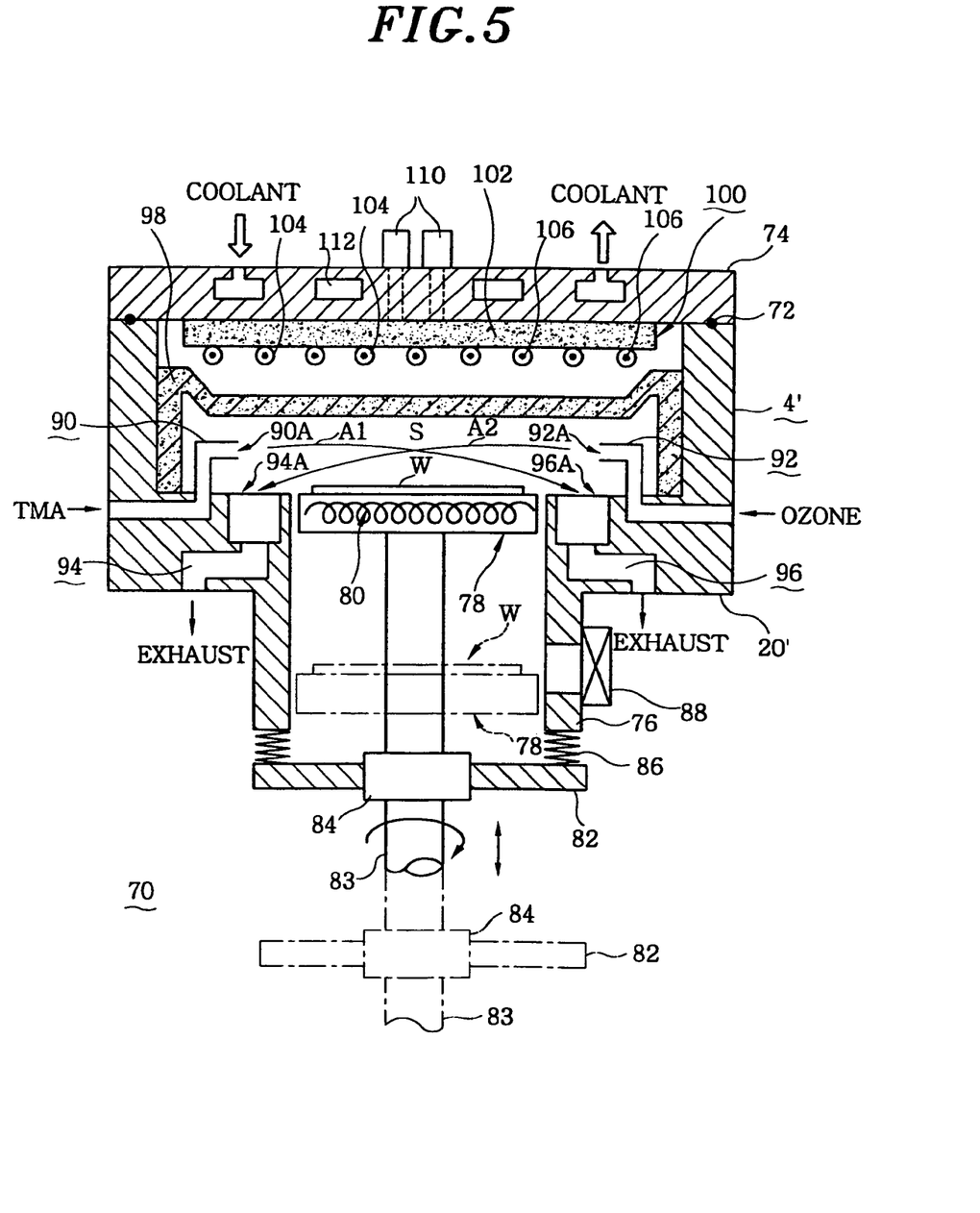
FIG. 5 depicts a cross sectional configuration view of a heat treatment apparatus in accordance with a second preferred embodiment of the present invention.
Figure 6:
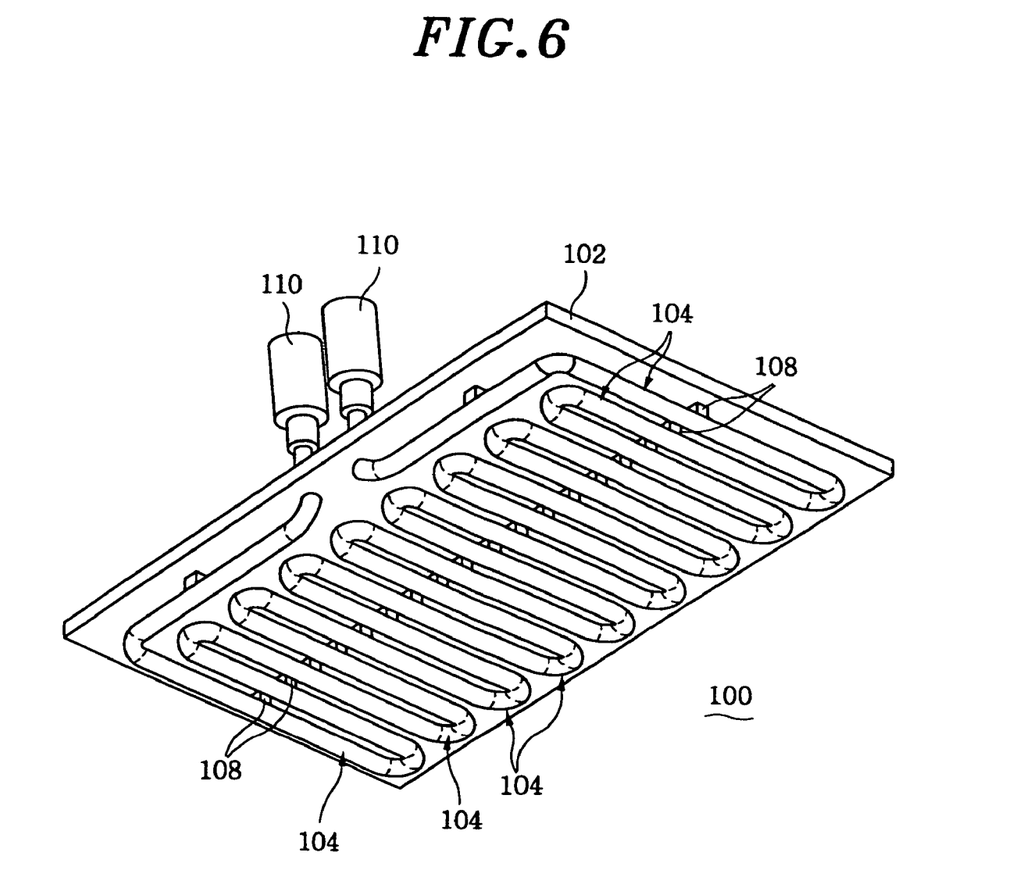
FIG. 6 is a perspective view of a heating unit for use in the second preferred embodiment.
Figure 7:
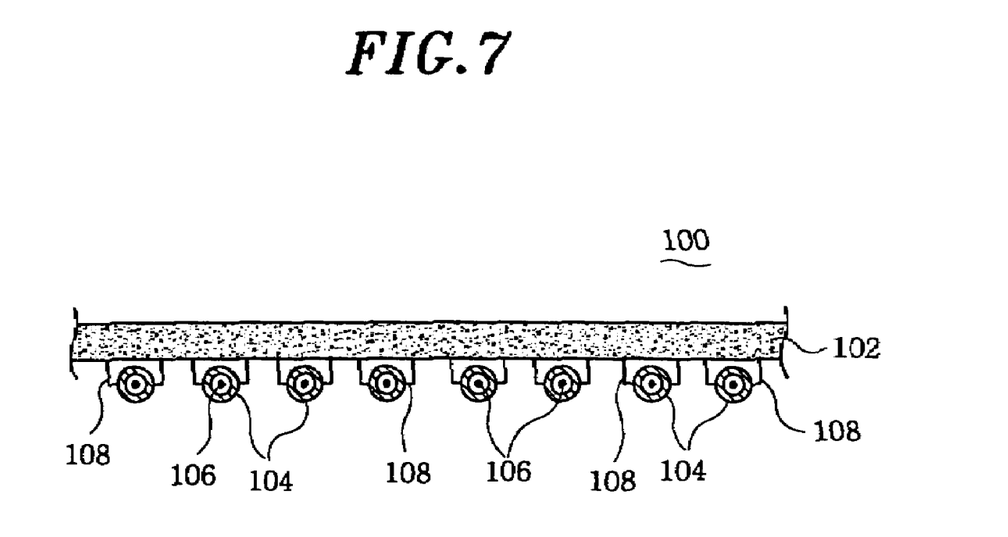
FIG. 7 provides a partially enlarged cross sectional view of the heating unit shown in FIG. 6.

FIG. 5 depicts a cross sectional configuration view of a heat treatment apparatus in accordance with the second preferred embodiment of the present invention; FIG. 6 is a perspective view of a heating unit for use in the second preferred embodiment; and FIG. 7 provides a partially enlarged cross sectional view of the heating unit shown in FIG. 6.

The heat treatment apparatus 70 of the second preferred embodiment has a cylindrical processing chamber 4' made of, for example, aluminum. In the processing chamber 4', a rectangular-shaped space is provided, for example. At the ceiling of the processing chamber 4', a ceiling portion 74 made of, for example, aluminum or the like is attached via a sealing member 72 which is formed of, e.g., O-ring or the like.

And, at the central portion of the bottom portion 20' of the processing chamber 4', a cylindrical mounting table receiving vessel 76 of a relatively large-diameter, is formed in a downward protruding shape. In the mounting table receiving vessel 76, a mounting table 78 made of ceramic, e.g., SiC or the like, is installed for mounting thereon a semiconductor wafer W as a target object. Inside the mounting table 78, e.g., a resistance heater 80 which is a target object heating unit to apply heat to the wafer W is encapsulated. At a central portion of the bottom surface of the mounting table 78, a rotation axis 83 extended downward is fixedly attached. The rotation axis 83 passes through a bottom plate 82 of the mounting table receiving vessel 76 via, e.g., a rotatable magnetic fluid sealing 84. Accordingly, the rotation axis 83 is supported rotatably and airtightly. Further, the bottom plate 82 is airtightly jointed to the lower end of the mounting table receiving vessel 76 by an expansible and contractible bellows 86. Accordingly, the bottom plate 82 and the mounting table 78 can be vertically movable as a unit by an actuator (not shown). Further, lifter pins (not shown) are provided on the bottom plate 82 for lifting the wafer W. Further, on a lower sidewall of the mounting table receiving vessel 76, a gate valve 88 opened and closed when the wafer W is loaded and unloaded is installed. As the mounting table 78 is placed at a lowered position, the loading and the transport of the wafer W are performed via the gate valve 88 between the inside and the outside.

Further, in the processing chamber 4', two, i.e., a first and a second, gas supply units 90 and 92 are installed on two opposite sides with the mounting table 78 being at the center therebetween. From the first and the second gas supply units 90 and 92, flow-controlled processing gases, e.g., film forming gases, are supplied when necessary. The first and the second gas supply units 90 and 92 are formed of, e.g., heat-resistant quartz pipes and have nozzles 90A and 92A. The respective nozzles 90A and 92A can be arranged on two opposite sides in the processing chamber 4' in such a manner that a plurality of nozzles is arranged in parallel on each side. In this case, the processing gases can be supplied in a planar shape.

On two sides of the bottom portion of the processing chamber 4', two, i.e., a first and a second, vacuum pumping systems 94 and 96 are installed in a manner of corresponding to the first and the second gas supply units 90 and 92. The atmosphere in the processing chamber 4' can be pumped to be evacuated to vacuum by vacuum pumps (not shown) of the vacuum pumping systems 94 and 96 when necessary. In this case, the first and the second vacuum pumping systems 94 and 96 are respectively connected to the gas exhaust ports 94A and 96A fronting the processing space.

Inside the processing chamber 4', a lid-shaped inner vessel 98 is installed in such a manner of covering processing space S on the mounting table 78. The inner vessel 98 has a good heat resistance, and further, it is made of a high-purity light absorbing material, e.g., SiC, which contains hardly any impurities of metal atoms or the like. The inner vessel 98 has the functions to be heated and thus accelerate the process reactions, and to align the gas flow of the processing gases. And, a heating unit 100 which is the feature of the present invention is installed between the inner vessel 98 and a wall surface of the ceiling plate 74 of the processing chamber 4'. The basic configuration of the heating unit 100 is substantially the same as that of the heating unit 40 described in conjunction with FIGS. 2 to 4.

That is, as shown in FIGS. 6 and 7, the heating unit 100 has a substantially rectangular-shaped reflector plate 102 which is greater than a diameter of the wafer W. The whole reflector plate 102 is made of strongly heat-resistant opaque quartz which is white turbid since it is intermixed with fine bubbles. In this case, the surface of the reflector plate 102 is nontransparent to externally incident heat rays, and reflects such heat rays with high reflectivity. And, the top surface of the reflector plate 102 is attached on the bottom surface of the ceiling plate 74. Further, a strongly heat-resistant and transparent quartz tube 104, formed to be bent in a predetermined shape, is jointed by welding to the bottom surface of the reflector plate 102. A carbon wire 106 which generates Joule heat when a current is applied thereto is inserted in the quartz tube 104. Connecting terminals 110 at two ends of carbon wire 106 upwardly pass through the reflector plate 102, and also pass through the ceiling plate 74 airtightly to be extended to the outside. When jointing the quartz tube 104 to the surface of the reflector plate 102, joint pins 108 (see FIGS. 6 and 7), also made of quartz, are used. Specifically, these joint pins 108 are disposed at proper places between the quartz tube 104 and the reflector plate 102, and by melting them, the quartz tube 104 and the reflector plate 102 are welded together.

Accordingly, heat rays from the carbon wire 106 inside the quartz tube 104 are reflected at the surface of the reflector plate 102 having high heat-resistance, and directed altogether downward in FIG. 5. Accordingly, the inner vessel 98 made of a light absorbing material can be heated to a predetermined temperature level. Further, a cooling jacket 112 is installed in the ceiling plate 74 to cool the ceiling plate 74. By flowing a coolant such as cooling water or the like in the cooling jacket 112, the ceiling plate 74 can be cooled.

The operation of the heat treatment apparatus having the above configuration will now be described. Herein, as an example of a heat treatment, the case of laminating extremely thin alumina films, each being one to several molecules in thickness, on a layer-by-layer basis, will be described.

The wafer W mounted on the mounting table 78 is heated and maintained at a predetermined temperature level, primarily by the resistance heater 80 embedded in the mounting table 78.

Further, the inner vessel 98 prepared in the processing chamber 4' is heated uniformly by the heating unit 100 prepared on an upper side of the inner vessel 98. That is, the heat rays from the carbon wire 106 inserted in the quartz tube 104 of the heating unit 100 are absorbed in the inner vessel 98 made of a light absorbing material, directly, or indirectly by being reflected by the reflector plate 102 supporting quartz tube 104, and thus heat the inner vessel 98 to a predetermined temperature level.

Meanwhile, the inner processing chamber 98 is supplied with film forming gases, as processing gases, in an intermittent manner, so that thin films are laminated into a multilayer stack. For example, a flow-controlled TMA (Tri-Methyl Aluminum) gas is supplied intermittently from the first gas supply unit 90, and a flow-controlled ozone gas is supplied intermittently from the second gas supply unit 92, flowing alternately with the supply of TMA gas. Accordingly, thin alumina films are laminated into a multilayer stack on the surface of the wafer W.

Specifically, when the TMA gas is supplied from the first gas supply unit 90, the second vacuum pumping system 96 on the opposite side of the nozzle 90A is driven, hence a gas flow in the direction of the arrow A1 is formed in the processing space S. On the contrary, when the ozone gas is supplied from the second gas supply unit 92, the first vacuum pumping system 94 on the opposite side of the nozzle 92A is driven, so that a gas flow in the direction of the arrow A2, opposite from A1, is formed in the processing space S. By repeating these manipulations, the film forming process is performed.

The reflector plate 102 which constitutes the heating unit 100 is made of high-purity opaque quartz which contains hardly any impurities. The quartz tube 104 and the carbon wire 106 also have a high purity containing hardly any impurities. Thus, contamination such as organic contamination and/or metal contamination can be substantially suppressed. Moreover, the relatively easy fabrication processes for the reflector plate 102 and the quartz tube 104 substantially reduce the manufacturing cost. Further, thermal energy can be used effectively and efficiently by using the reflector plate 102.

Moreover, a large amount of electric power can be supplied since the main components of the heating unit 100 are made of quartz which is strongly resistant to thermal shocks. Accordingly, a high temperature rising rate, for example, about 1000° C./5 minutes can be obtained.

Further, instead of the mounting table 78 of the second preferred embodiment, the mounting table 32 described with reference to FIGS. 1 to 4, that is, the mounting table which includes the integrally built-in heating unit can be used. In this case, contamination to the wafer W can be suppressed still further.

Furthermore, heating lamps can be used instead of the resistance heater 80 as a target object heating unit.

Still further, the inner vessel 98 may be made of transparent or opaque quartz. Further, a target object can be heated directly without installing the inner vessel 98.

Though the second preferred embodiment has described the case of forming alumina film, the present invention is not limited thereto. The present invention can be applied to any film forming processes.

Figure 8:
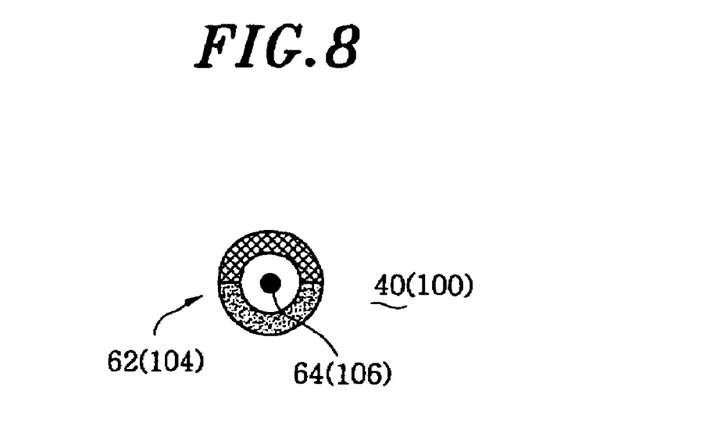
FIG. 8 illustrates an enlarged cross sectional view of a modified embodiment of the heating unit.

Furthermore, though the heating unit 40 (100) is formed by inserting the carbon wire 64 (106) in the transparent quartz tube 62 (104) in the above-described preferred embodiments, the present invention is not limited thereto. For example, as shown in FIG. 8, the lower half portion (upper half portion) of the quartz tube 62 (104) may be made of opaque quartz for reflection, and the upper half portion (lower half portion) may be made of transparent quartz to raise the thermal efficiency. In this case, a wafer has to be positioned on the side of transparent quartz.

Moreover, though the above preferred embodiments have described the cases of performing the film forming process as the heat treatment process, the present invention is not limited thereto. The present invention can be applied to different heat treatment processes such as oxidation/diffusion process, annealing process, and quality modification process.

Further, though the above preferred embodiments have described the film forming apparatuses by thermal CVD, the present invention is not limited thereto. The present invention can be applied to such apparatus as plasma CVD processing apparatus, etching processing apparatus, oxidation/diffusion processing apparatus, and sputter processing apparatus.

Still further, though the above preferred embodiments have described the cases of using a semiconductor wafer as a target object as an example, the present invention is not limited thereto. The present invention can be applied to LCD substrate, glass substrate and the like.

What is claimed is:

1. A mounting table for holding a target object, comprising:
   a heating unit including a reflector plate made of an opaque quartz, and a quartz tube welded to a surface of the reflector plate, and
   a mounting table cover member having an open cylindrical shape with a closed upper surface and a peripheral sidewall, and installed to cover the reflector plate with said peripheral sidewall extending along an outermost surface of the reflector plate to a position at a base of the reflector plate, the target object being mounted thereon,
   wherein the mounting table cover member is made of a light absorbing material, and a carbon wire which generates heat when a current is applied thereto is disposed between the reflector plate and the mounting table cover member, wherein the mounting table cover member has a circular lid shape and an inner surface of a sidewall of the mounting table cover member has a diameter greater than a diameter of the reflector plate so that the inner surface of the sidewall of the mounting table cover member is in contact with a side surface of the reflector plate to be circumscribed thereto, and wherein a positioning projection having a ring-shape and made of a same material as that of the reflector plate is provided in an upper direction at a peripheral region of the reflector plate to form a component of the outermost surface of the reflector plate and positions the mounting table cover member which is inserted by the positioning projection, the positioning projection contacting with the mounting table cover member.

2. The mounting table of claim 1, wherein the mounting table cover member is made of SIC.

3. The mounting table of claim 1, wherein the quartz tube is divided and welded to a plurality of zones on the surface of the reflector plate.

4. The mounting table of claim 1, further comprising joint pins, wherein the quartz tube is jointed to the surface of the reflector plate by the joint pins.

5. The mounting table of claim 1, wherein a lower half portion of the quartz tube is opaque quartz, and an upper half portion of the quartz tube is transparent quartz.

6. The mounting table of claim 1, wherein the carbon wire is inserted in the quartz tube disposed in a space surrounded by the reflector plate and the mounting table cover member and the diameter of the inner surface of the sidewall of the mounting table cover member is slightly greater than the diameter of the reflector plate so that the inner surface of the mounting table cover member is in close contact with the side surface of the reflector plate.

7. The mounting table of claim 1, wherein the positioning projection is disposed along an edge of the reflector plate and comprises a side wall contacting the mounting table cover member along a height of the mounting table cover member.

8. A heat treatment apparatus for treating a target object, comprising:

a mounting table including a heating unit having a reflector plate made of an opaque quartz, and a quartz tube welded to a surface of the reflector plate; a mounting table cover member having an open cylindrical shape with a closed upper surface and a peripheral sidewall, and installed to cover the reflector plate with said peripheral sidewall extending along an outermost surface of the reflector plate to a position at a base at a base of the reflector plate, the target object being mounted thereon, wherein the mounting table cover member is made of a light absorbing material, and a carbon wire which generates heat when a current is applied thereto is disposed between the reflector plate and the mounting table cover member;

a processing chamber accommodating therein the mounting table; a gas supply unit for supplying a gas in the processing chamber; and a vacuum pumping system for evacuating the processing chamber, wherein the mounting table cover member has a circular lid shape and an inner surface of a sidewall of the mounting table cover member has a diameter greater than a diameter of the reflector plate so that the inner surface of the sidewall of the mounting table cover member is in contact with a side surface of the reflector plate to be circumscribed thereto, and wherein a positioning projection having a ring-shape and made of a same material as that of the reflector plate is provided in an upper direction at a peripheral region of the reflector plate to form a component of the outermost surface of the reflector plate and positions the mounting table cover member which is inserted by the positioning projection, the positioning projection contacting with the mounting table cover member.

9. The heat treatment apparatus of claim 8, wherein the quartz tube is bent.

10. The heat treatment apparatus of claim 8, wherein the quartz tube is divided and welded to a plurality of zones on the surface of the reflector plate.

11. The mounting table of claim 8, wherein the carbon wire is inserted in the quartz tube disposed in a space surrounded by the reflector plate and the mounting table cover member and the diameter of the inner surface of the sidewall of the mounting table cover member is slightly greater than the diameter of the reflector plate so that the inner surface of the mounting table cover member is in close contact with the side surface of the reflector plate.

12. The mounting table of claim 8, wherein the positioning projection is disposed along an edge of the reflector plate and comprises a side wall contacting the mounting table cover member along a height of the mounting table cover member.

* * * * *